(12) United States Patent  
Yoshizaki et al.

(10) Patent No.: US 7,493,098 B2  
(45) Date of Patent: Feb. 17, 2009

(54) SEMICONDUCTOR INTEGRATED CIRCUIT

(75) Inventors: Yasunobu Yoshizaki, Takasaki (JP); Tetsuya Wakuda, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 502 days.

(21) Appl. No.: 11/387,897

(22) Filed: Mar. 24, 2006

(65) Prior Publication Data

US 2006/0223474 A1    Oct. 5, 2006

(30) Foreign Application Priority Data

Mar. 29, 2005   (JP)   ............................ 2005-093840

(51) Int. Cl.  
*H04B 1/28* (2006.01)

(52) U.S. Cl. ...................... 455/333; 455/252.1; 455/323

(58) Field of Classification Search .............. 455/232.1, 455/234.1, 252.1, 313, 323, 333, 307, 339, 455/552.1, 553.1  
See application file for complete search history.

(56) References Cited

U.S. PATENT DOCUMENTS 3,886,458 A * 5/1975 Matsumoto et al. ......... 455/333

6,725,030 B2 * 4/2004 Vathulya .................. 455/252.1  
6,901,249 B1 * 5/2005 Kobayashi ................. 455/333  
6,947,720 B2 * 9/2005 Razavi et al. ............... 455/333

FOREIGN PATENT DOCUMENTS

JP    2004-104040    4/2004

* cited by examiner

*Primary Examiner*—Quochien B Vuong  
(74) *Attorney, Agent, or Firm*—Mattingly, Stanger, Malur & Brundidge, P.C.

(57) ABSTRACT

In a communication semiconductor integrated circuit, a capacitance included in a filter on the output side of a mixer circuit is reduced without requiring the cutoff frequency of the filter to be changed. A Gilbert cell circuit is used as a mixer circuit which combines, for downconversion, a reception signal and a local oscillator signal. A low-pass filter for removing unwanted waves from output is composed of load resistors of upper stage differential transistors and a capacitive element provided between differential output terminals. The resistances of the load resistors are increased, and a current circuit for applying a current to emitters or collectors of the upper stage differential transistors is provided, so that a current to make up for a decrease in current amount attributable to the increase in load resistance can be applied from the current circuit to lower stage differential transistors.

10 Claims, 5 Drawing Sheets

SEMICONDUCTOR INTEGRATED CIRCUIT

CROSS-REFERENCE TO RELATED APPLICATION

The present application claims priority from Japanese patent application No. 2005-093840 filed on Mar. 29, 2005, the content of which is hereby incorporated by reference into this application.

BACKGROUND OF THE INVENTION

The present invention relates to a technique effective in forming on an IC chip a filter with a reduced capacitance to be provided on the output side of a direct downconversion mixer which, for frequency conversion, combines a reception signal and an oscillator signal of a prescribed frequency. More particularly, the invention relates to a technique which can be effectively applied, for example, to a semiconductor integrated circuit (radio frequency IC) for processing radio frequency signals.

In a radio communication system such as a portable telephone, a radio frequency IC (RF IC) incorporating a mixer which, for frequency conversion, combines a reception signal and an oscillator signal of a prescribed frequency is used. Conventionally proposed portable telephones include dual-band portable telephones capable of processing signals on two frequency bands, for example, the 925 to 960 MHz GSM (Global System for Mobile Communication) and the 1,805 to 1,880 MHz DCS (Digital Cellular System). In recent years, there is also a demand for triple-band portable telephones which can process signals, for example, on the 1,930 to 1,990 MHz PCS (Personal Communication System) in addition to those on the GSM and DCS. It is considered that portable telephones compatible with more bands will come into demand in the future.

For an RF IC for use in a portable telephone compatible with plural bands, a direct conversion type is effective from a viewpoint of reducing the number of components. The output of a mixer which, for frequency conversion, combines a reception signal and an oscillator signal of a prescribed frequency contains a signal component of a frequency equivalent to a frequency difference between the two signals and signal components of other frequencies. In the receiver circuit including the mixer, a low-pass filter for removing unwanted waves and signals of adjacent channels is provided on the output side of the mixer.

The output signal of a direct conversion mixer is required to have a frequency of several hundred kHz. Therefore, the cutoff frequency of the low-pass filter provided on the output side of the mixer is required to be several hundred kHz. To realize such a cutoff frequency, it is necessary to use a capacitive element having a very large capacitance, that is, 1,000 pF or more. Such a requirement used to be met by using an external capacitive element. A technique in which an external element is used as a capacitive element for inclusion in a low-pass filter to be provided on the output side of a Gilbert cell mixer is disclosed in Japanese Unexamined Patent Publication No. 2004-104040.

SUMMARY OF THE INVENTION

Using an external element as a capacitive element for inclusion in a low-pass filter as described above results in a larger number of components. An RF IC includes two mixers, one for demodulating an I signal which is an in-phase component relative to a fundamental wave and the other for demodulating a Q signal which is an orthogonal component relative to the fundamental wave. A low-pass filter is disposed downstream of each of the mixers. Therefore, two external capacitive elements are required for the two mixers. This increases the total number of components required. In addition, a total of four external terminals are required to connect the two external capacitive elements to the RF IC. This results in a larger chip size, so that the chip cannot be made smaller.

The inventors of the present invention considered, from a viewpoint of reducing the number of elements, a technique for configuring a low-pass filter to be disposed on the output side of a mixer. In the technique, a capacitive element is connected between differential output terminals of a mixer, the capacitive element and load resistors included in the mixer make up a filter, and the capacitive element is incorporated in the chip.

The low-pass filter provided on the output side of a direct conversion mixer is, however, required to have a cutoff frequency of several hundred kHz as described above. To realize such a cutoff frequency, it is necessary to use a capacitive element having a very large capacitance, that is, 1,000 pF or more. A capacitive element having such a large capacitance when formed on a chip occupies a large chip area. An RF IC chip incorporating such capacitive elements, therefore, becomes larger than an equivalent IC chip using external capacitive elements.

The cutoff frequency fc of a low-pass filter is represented by an equation: $fc=1/(2 \cdot \pi \cdot C \cdot 2R)$. It is known from the equation that increasing the resistances of resistors included in the filter makes it possible to reduce the capacitance of the filter. However, increasing the resistances of resistors included in a mixer without changing the amount of current passing through the mixer lowers the bias point (DC level) of the mixer output causing the mixer output to saturate or the dynamic range of a downstream high-gain amplifier circuit to be narrowed.

An RF IC, as being described later, has a high gain amplifier circuit being disposed downstream of the mixer and being composed of plural variable gain amplifiers connected in a multistage configuration. When the bias point of the mixer output lowers, it becomes necessary to correspondingly adjust the DC input level of the high gain amplifier circuit. Making such a design change is very troublesome.

To prevent the bias point of the mixer output from lowering, it may be considered to reduce the current applied to the mixer by an amount corresponding to the increase in the load resistance of the mixer. Increasing the load resistance and reducing the current, however, reduces the current applied to lower stage differential transistors of the mixer. As a result, it may become impossible to achieve a desired noise characteristic or a desired signal distortion characteristic.

An object of the present invention is to provide a communication semiconductor integrated circuit (RF IC) in which the capacitance of a capacitive element included in a filter provided on the output side of a mixer circuit for downconverting a reception signal is reduced without changing the cutoff frequency of the filter, thereby making it easy to form the element on the IC chip and reduce the number of external elements required.

Another object of the present invention is to provide a communication semiconductor integrated circuit (RF IC) in which the capacitance of a capacitive element included in a filter on the output side of a mixer circuit for downconverting a reception signal can be reduced without deteriorating characteristics of the mixer circuit and a downstream amplifier circuit, without largely increasing the chip size, and without changing the cutoff frequency of the filter.

The above and other objects; and novel features of the present invention will become apparent from the following description and the accompanying drawings.

The following is an outline of a representative one of the inventions disclosed in this application.

According to the invention, a Gilbert cell circuit is used as a mixer circuit which combines a reception signal and a local oscillator signal for downconversion, and a low-pass filter for removing unwanted waves from an output signal is made up of load resistors of upper stage differential transistors and a capacitive element connected between differential output terminals. In this configuration, the resistances of the load resistors are increased, and, with a current circuit for applying a current to emitters or collectors of the upper stage differential transistors provided, a current whose amount corresponds to the increase in the resistances of the load resistors is applied to lower stage differential transistors.

According to the above arrangement, by increasing the resistances of the load resistors, the capacitance of the filter provided on the output side of the mixer circuit can be reduced without changing the cutoff frequency of the filter. As a result, it becomes easier to form the capacitive element on the IC chip. Also, as a current to make up for a current decrease caused by the increase in the resistances of the load resistors can be applied to the lower stage differential transistors, the capacitive element can be made smaller without deteriorating characteristics of the mixer circuit and a downstream amplifier circuit. In this way, the capacitive element to be included in the filter on the output side of the mixer circuit can be formed on the chip without largely increasing the chip size.

It is desirable that the current circuit used for current application has an impedance adequately higher than those of nodes to which the current is applied. This is to prevent an input signal from leaking into the current circuit used for current application. A current mirror circuit using MOSFETs is an example of a current circuit having a high impedance.

A representative one of the inventions disclosed in this application has advantageous effects as briefly described below.

According to the invention, the capacitance of a capacitive element included in a filter provided on the output side of a mixer circuit for downconverting a reception signal can be decreased thereby making it easy to form the element on a chip. Forming the capacitive element on a chip reduces the number of system components enabling the system to be made smaller. Also, when the capacitive element is formed on a chip, terminals for connecting an external capacitive element are no longer required, and it becomes unnecessary to perform wire bonding operation. As a result, production cost can be reduced, and generation of spurious signals attributable to radio frequency (RF) signals captured via bonding wire or a frame can be reduced. According to the invention, a capacitive element to be included in a filter provided on the output side of a mixer circuit can be formed on a chip without deteriorating characteristics of the mixer circuit and a downstream amplifier and without requiring the chip size to be largely increased.

BRIEF DESCRIPTION OF THE DRAWINGS

FIG. 6 is a circuit diagram showing an equivalent circuit of the mixer circuit of the embodiment shown in FIG. 5 with upper stage differential transistors Q21 and Q24 being on.

DETAILED DESCRIPTION OF THE PREFERRED EMBODIMENTS

Embodiments of the present invention will be described in the following with reference to the accompanying drawings.

Figure 1:
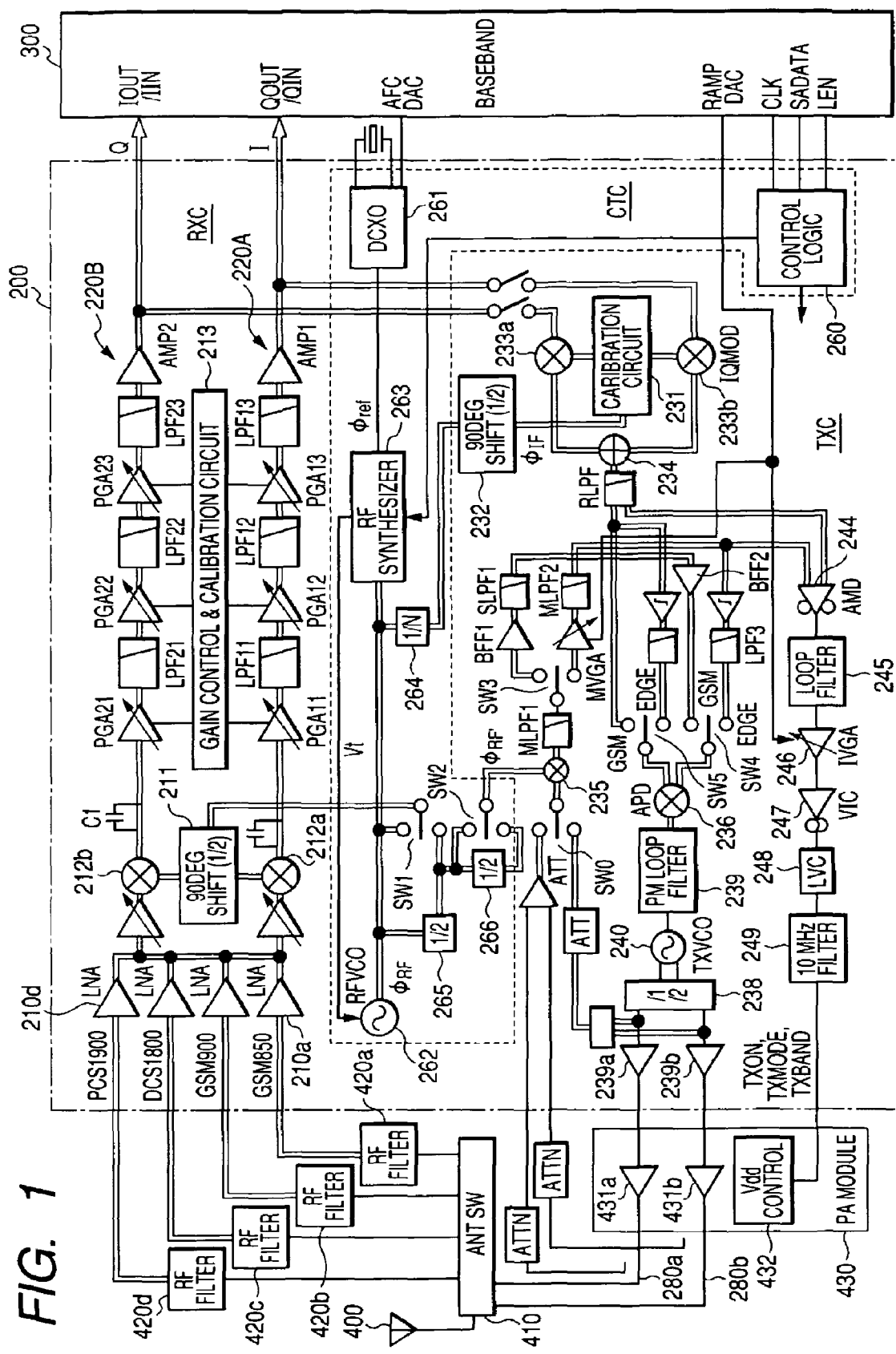
FIG. 1 is a block diagram showing an example semiconductor integrated circuit device (RF IC) according to the present invention and an example radio communication system using it.

FIG. 1 shows an example of a communication semiconductor integrated circuit device (RF IC) according to the present invention and an example of a radio communication system using the same.

As shown in FIG. 1, the system includes an antenna 400 for transmitting and receiving a signal wave, a switch 410 for switching between transmission and reception, RF filters 420a to 420d each including a SAW filter for removing unwanted waves from a reception signal, an RF power amplifier circuit (power module) 430 for amplifying a transmission signal, an RF IC 200 for demodulating a reception signal and modulating a transmission signal, and a baseband circuit 300 which performs baseband processing such as converting transmission audio and data signals into I and Q signals and converting received and demodulated I and Q signals into audio and data signals and which transmits a signal for controlling the RF IC 200. Though not particularly limited, the RF IC 200 and the baseband circuit 300 are each composed of a semiconductor integrated circuit formed on a discrete semiconductor chip.

The RF IC 200 is broadly composed of a receiver circuit RXC, a transmitter circuit TXC, and a control circuit CTC which includes circuits common to the RXC and TXC, for example, control circuits other than the receiver circuit RXC and transmitter circuit TXC, and a clock generation circuit. Mixer circuits 212a and 212b which are subjects of the present invention are provided in the receiver circuit RXC. They combine an RF reception signal and an orthogonal signal generated by frequency dividing, in a frequency dividing phase shift circuit 211, a local oscillator signal supplied from an RFVCO 262, then downconvert and orthogonally demodulate the combined signal thereby generating reception baseband I and Q signals. The receiver circuit RXC according to the present embodiment employs a direct conversion system in which a reception signal is downconverted directly into a signal of a baseband frequency.

Figure 2:
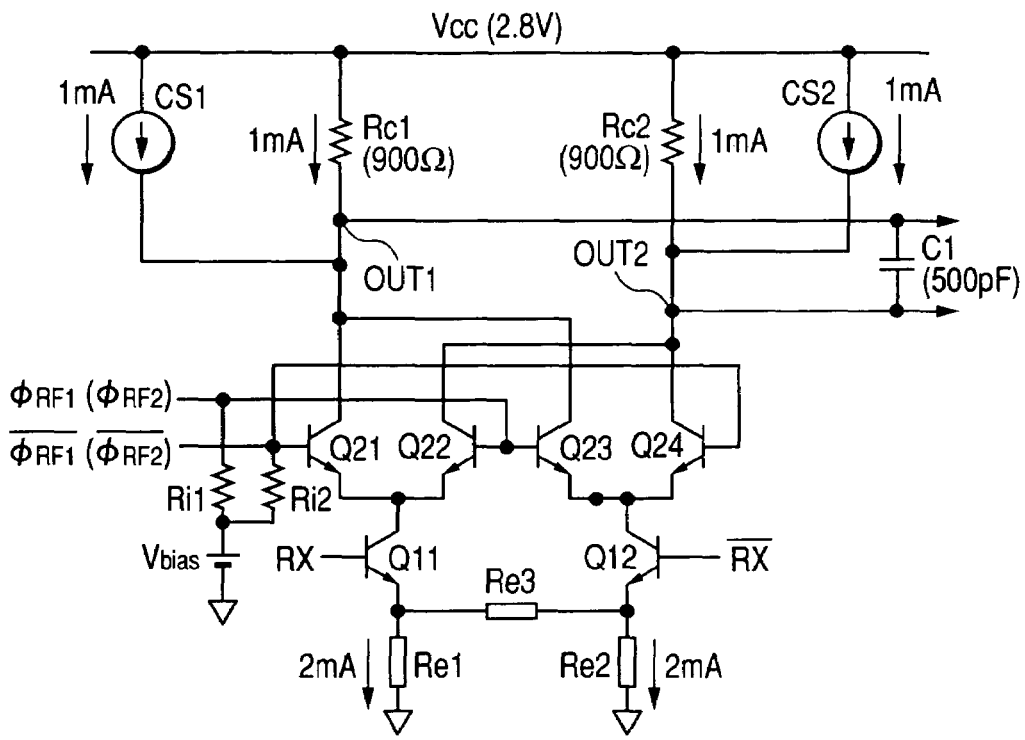
FIG. 2 is a circuit diagram showing a first embodiment of a mixer circuit included in a receiver circuit of the RF IC according to the present invention.

First, the mixer circuits 212a and 212b on the receiver side and downstream low-pass filters will be described; the RF IC 200 will be described in detail later. FIG. 2 shows a concrete example of a circuit including one of the mixer circuits 212a and 212b and downstream low-pass filters. The mixer circuit 212a on the I signal side and the mixer circuit 212b on the Q signal side have an identical configuration. Hence, only one of the mixer circuits is shown.

As shown in FIG. 2, the mixer circuit of this embodiment is composed of a differential circuit which is called a Gilbert cell and in which an upper stage differential multiplier section is vertically stacked over a lower stage differential input section. The lower stage differential input section of the mixer circuit is composed of a pair of input differential transistors Q11 and Q12 having commonly connected emitters, emitter resistors Re1 and Re2 connected between the transistor Q11 and ground and between the transistor Q12 and ground, respectively, and a resistor Re3 connected between the emitters of the transistors Q11 and Q12. A bias voltage source Vbias for providing an operating point (amplitude center potential) for input RF signals RX and /RX is connected to the base terminals of the input differential transistors Q11 and Q12 via resistors Ri1 and Ri2.

The upper stage multiplier section of the mixer circuit according to the present embodiment is composed of a pair of differential transistors Q21 and Q22 connected to the collector of the transistor Q11 out of the pair of the lower stage differential transistors Q11 and Q12 having the commonly connected emitters, and a pair of differential transistors Q23 and Q24 connected to the collector of the transistor Q12.

The collectors of the upper stage differential transistors Q21 and Q23 are interconnected. They are connected to a supply voltage Vcc (for example, 2.8 V) via a collector resistor Rc1 connected as a load resistance. The collectors of the upper stage differential transistors Q22 and Q24 are interconnected. They are connected to the supply voltage Vcc via a collector resistor Rc2. The gain of this circuit is determined by the resistance ratio between the composite resistance of the emitter resistors Re1, Re2 and Re3 and the resistance of the collector resistors Rc1 and Rc2. Furthermore, in the mixer circuit according to the present embodiment, the common collector of a pair of the transistors Q21 and Q23 and the common collector of a pair of the transistors Q22 and Q24 provide output nodes OUT1 and OUT2, respectively. A capacitor C1 which, along with the collector resistors Rc1 and Rc2, makes up a low-pass filter is connected between the output nodes OUT1 and OUT2.

A reception signal RX amplified by an upstream low-noise amplifier is inputted, as differential signals RX and /RX which are 180 degrees apart in phase from each other to the base terminals of the input differential transistors Q11 and Q12, respectively. The common emitter of the emitter-connected differential transistors Q21 and Q22 included in the upper stage multiplier section is connected to the collector of the lower stage input differential transistor Q11. Similarly, the common emitter of the emitter-connected differential transistors Q23 and Q24 included in the upper stage multiplier section is connected to the collector of the lower stage input differential transistor Q12. In this configuration, the reception signal inputted to the lower stage differential input section is inputted, as current signals, to the emitters of the transistors Q21 to Q24 included in the upper stage multiplier section.

An RF oscillator signal φRF1 (or φRF2) from the frequency dividing phase shift circuit 211 is inputted to the base terminals of the upper stage differential transistors Q21 and Q24. An oscillator signal /φRF1 (or /φRF2) which is, being an inversion of the φRF1, 180 degrees apart in phase from the φRF1 is inputted to the base terminals of the upper stage differential transistors Q22 and Q23. The φRF2 is an oscillator signal 90 degrees apart in phase from the φRF1. The /φRF2 is an oscillator signal 270 degrees apart in phase from the φRF1.

The reception signals RX and /RX respectively inputted to the base terminals of the transistors Q11 and Q12 included in the lower stage differential input section are multiplied by the RF oscillator signals φRF1 and /φRF1, respectively. An I signal having a frequency component equivalent to the difference in frequency between the two products obtained by the multiplications described above, and a /I signal which is 180 degrees apart in phase from the I signal are outputted from the output nodes OUT1 and OUT2, respectively. In the other mixer circuit, the reception signals RX and /RX are multiplied by the RF oscillator signals φRF2 and /φRF2, respectively. A Q signal having a frequency component equivalent to the difference in frequency between the two products obtained by the above multiplications, and a /Q signal which is 180 degrees apart in phase from the Q signal are outputted.

In the mixer circuit according to the present embodiment, current sources CS1 and CS2 for applying electric currents to the collectors of the transistors Q21 and Q23 and the collectors of the transistors Q22 and Q24, respectively, are provided. The collector resistors Rc1 and Rc2 for the upper stage differential transistors Q21 and Q23 and the upper stage differential transistors Q22 and Q24, respectively, are each made of an element having a resistance larger than it would be if the current sources CS1 and CS2 were not used. In other words, the current sources CS1 and CS2 that respectively apply currents to the common collector of the upper stage differential transistors Q21 and Q23 and the common collector of the upper stage differential transistors Q22 and Q24 are provided to make up for decreases in current attributable to the use of the elements with a large resistance. The capacitor C1 included in the low-pass filter connected between the output nodes OUT1 and OUT2 is made of an element having a capacitance smaller than it would be if the current sources CS1 and CS2 were not used.

The above arrangement will be described using concrete figures in the following. Assume a case in which the mixer circuit without including the current sources CS1 and CS2 is designed to cause a current of 2 mA to be applied to each of the collector resistors Rc1 and Rc2 each having a resistance of 450 ohms. If the current sources CS1 and CS2 are included in the mixer circuit with the current to be applied by each of the current sources being set to 1 mA and if the resistances of the collector resistors Rc1 and Rc2 are to be changed not to change the current applied to each of the lower stage differential transistors Q11 and Q12, the current required to be applied to each of the collector resistors Rc1 and Rc2 is 1 mA, that is, one half of the 2 mA. Therefore, the resistance of each of the collector resistors Rc1 and Rc2 can be increased twofold to 900 ohms.

The cutoff frequency fc of the low-pass filter is represented by an equation: $fc=1/(2 \cdot \pi \cdot C \cdot 2R)$. In this equation, the resistance that should normally be expressed as 'R' is expressed as '2R'. This is because the circuit according to the present embodiment has a differential configuration. The equation indicates that doubling the resistance of each of the collector resistors Rc1 and Rc2 included in the low-pass filter makes it possible to halve the capacitance of the capacitor C1 connected between the output nodes OUT1 and OUT2. In the present example, if the capacitance of the capacitor C1 connected between the output nodes OUT1 and OUT2 is 1,000 pF without the current sources CS1 and CS2 being provided, the capacitance can be halved to 500 pF by providing the current sources CS1 and CS2.

To achieve a capacitance of 1000 pF using an MIM (Metal-Insulator-Metal) in the process employed by the inventors of the present invention, the MIM capacitor is required to have an area of about 0.3 mm$^2$. Such an MIM capacitor if formed on a semiconductor chip of 3.5 mm by 3.5 mm occupies nearly 2.5% of the chip area. When the capacitance requirement is reduced by half, from 1000 pF to 500 pF, the capacitor can be formed in about 1.2% of the chip area. Since using an on-chip capacitor can reduce the number of required external terminals by four, the chip area increase required to enable the 500 pF capacitor to be formed on the chip can be held at 1% or less.

Halving the capacitance of the capacitor included in the filter results in a larger resistance value and a larger number of component elements (MOSFETs). However, since resistors and transistors are smaller than capacitors, a relative increase in chip area caused when the capacitance of the capacitor is reduced involving increases in resistance value and in the number of component elements is not so large. In cases where additional resistors and component elements can be formed in unused space on the chip, the semiconductor chip may require almost no increase in chip size.

Furthermore, according to the present embodiment, the resistance of each of the collector resistors Rc1 and Rc2 is doubled and the current passing through each of the collector resistors Rc1 and Rc2 is halved. Therefore, the voltage drops at the collector resistors Rc1 and Rc2 are unchanged. Hence, it does not happen that the mixer output bias point (DC level) lowers causing the mixer output to saturate or the dynamic range of a downstream high-gain amplifier circuit to be narrowed. Even though the resistance of each of the collector resistors Rc1 and Rc2 is doubled and the amount of current passing through each of the resistors is halved, with the current sources CS1 and CS2 being provided, the amount of current passing through each of the lower stage differential transistors Q11 and Q12 remains unchanged. It is therefore unnecessary to change the resistance values of the emitter resistors Re1, Re2 and Re3.

Another advantage is that a problem of not being able to obtain a desired noise characteristic or signal-to-noise characteristic because of a change in emitter resistance or a decrease in current value does not occur. In other words, the gain of the Gilbert cell mixer circuit is determined by the ratio between the composite resistance of the upper stage collector resistors Rc1 and Rc2 and the composite resistance of the emitter resistors Re1, Re2, and Re3, and the amount of current passing through the resistors. Therefore, to increase the resistances of the collector resistors Rc1 and Rc2 without affecting the gain of the mixer circuit, it is necessary to increase the resistances of the emitter resistors Re1, Re2 and Re3. Increasing the resistances of the emitter resistors, however, causes a problem by allowing thermal noise of the emitter resistors themselves to increase and the noise characteristic of the mixer circuit to deteriorate. According to the present embodiment, even when the resistances of the collector resistors Rc1 and Rc2 are increased, the amount of current passing through the lower stage of the mixer circuit does not change, so that it is not necessary to change the resistances of the emitter resistors. Thus, the problem as described above can be avoided.

Figure 3:
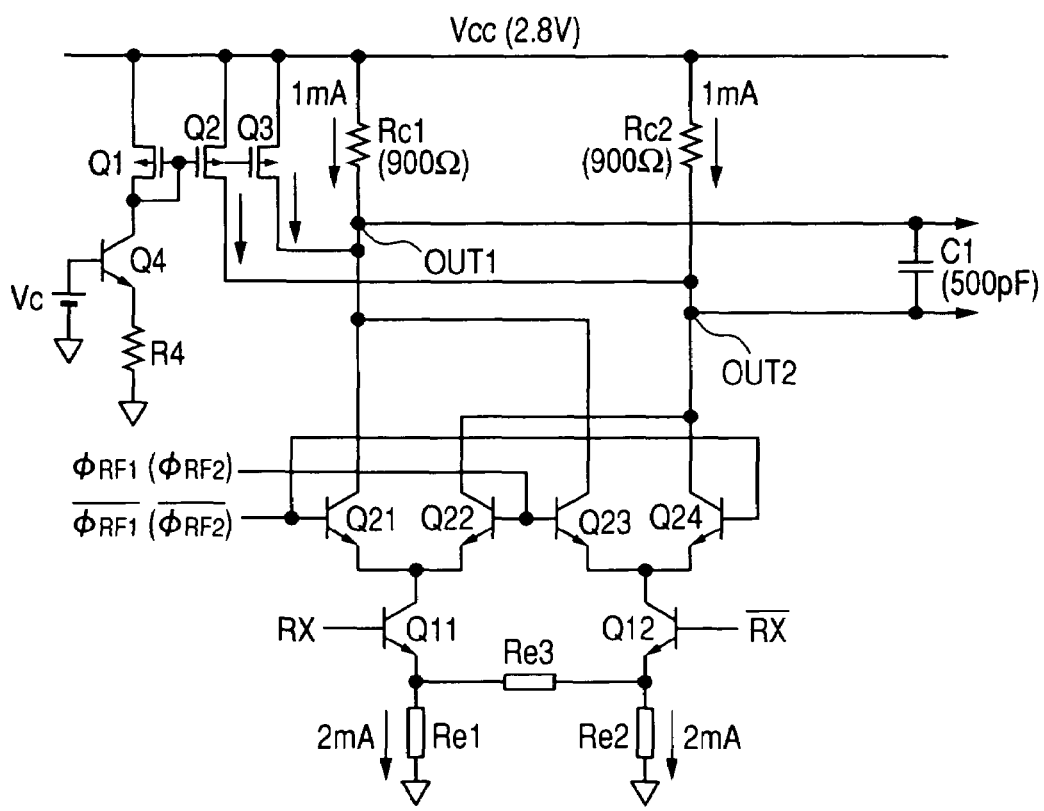
FIG. 3 is a circuit diagram showing a more concrete configuration of the mixer circuit of the first embodiment.

FIG. 3 shows a more concrete example of configuration of the mixer circuit of the embodiment shown in FIG. 2.

In this example, a current mirror circuit including p-channel metal oxide semiconductor field effect transistors (hereinafter referred to as PMOSFETs) is used as the current sources CS1 and CS2. The current mirror circuit is composed of a PMOSFET Q1 of a diode connection in which a gate and a drain are coupled, a bipolar transistor Q4 connected in series with the PMOSFET Q1, an emitter resistor R4 of the bipolar transistor Q4, and PMOSFETs Q2 and Q3 which share a common gate with the PMOSFET Q1. The PMOSFETs Q2 and Q3 are elements of a same size. The drain terminals of the PMOSFETs Q2 and Q3 are connected to the common collector of the upper stage differential transistors Q22 and Q24 and the common collector of the upper stage differential transistors Q21 and Q23, respectively.

A constant voltage Vc is applied to the base terminal of the bipolar transistor Q4, so that the bipolar transistor Q4 functions as a constant current source. The current Ic of the constant current source is applied to the PMOSFET Q1. Since the PMOSFET Q1 and the PMOSFETs Q2 and Q3 make up a current mirror configuration, N times the current passing through the PMOSFET Q1 is applied to the PMOSFETs Q2 and Q3 with "N" representing the size ratio between the PMOSFET Q1 and each of the PMOSFETs Q2 and Q3. For example, where the current Ic of the constant current source is 0.5 mA and the transistor size ratio is 1:2, a current of 1 mA is made to pass through each of the PMOSFETs Q2 and Q3. The currents passed through the PMOSFETs Q2 and Q3 are then respectively applied to the common collector of the upper stage differential transistors Q22 and Q24 and the common collector of the upper stage differential transistors Q21 and Q23.

In the configuration shown in FIG. 3, a current mirror circuit including PMOSFETs is used for current application. In this configuration, each of the PMOFETs has an impedance of several mega-ohms which is high enough compared with the resistance, several hundred ohms, of each of the collector resistors Rc1 and Rc2 for the upper stage differential transistors Q21 and Q23 and for the upper stage differential transistors Q22 and Q24, respectively, so that no problem is caused circuitwise when currents are applied using the PMOSFETs.

Figure 4:
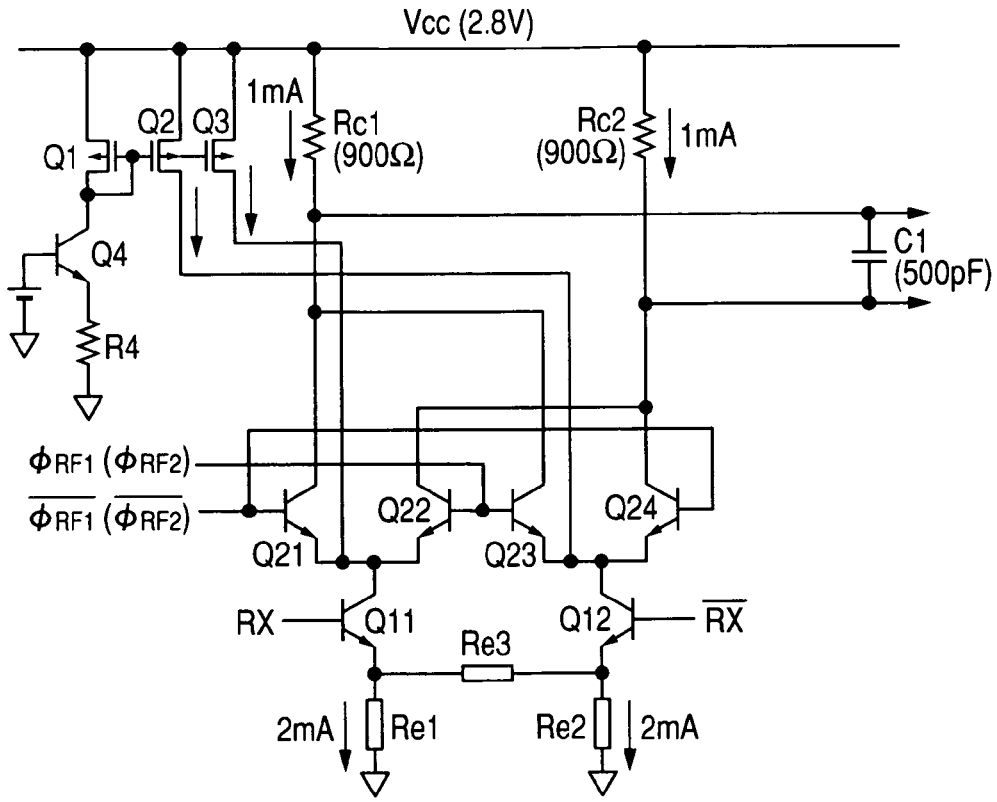
FIG. 4 is a circuit diagram showing a second embodiment of the mixer circuit included in the receiver circuit of the RF IC according to the present invention.

FIG. 4 shows an example of configuration of a mixer circuit according to a second embodiment.

In this embodiment, a current mirror circuit including PMOSFETs is used as the current sources CS1 and CS2. The drain terminals of the PMOSFETs Q2 and Q3 included in the current mirror circuit are connected to the collectors of the lower stage differential transistors Q12 and Q11 of the mixer circuit, respectively, so that the currents from the PMOSFETs Q2 and Q3 are directly applied to the lower stage differential transistors Q12 and Q11. Using this configuration causes no problem circuitwise, since the impedances of the PMOSFETs included in the current mirror circuit are adequately higher than the impedances of the collector connection nodes of the lower stage differential transistors Q12 and Q11.

Figure 5:
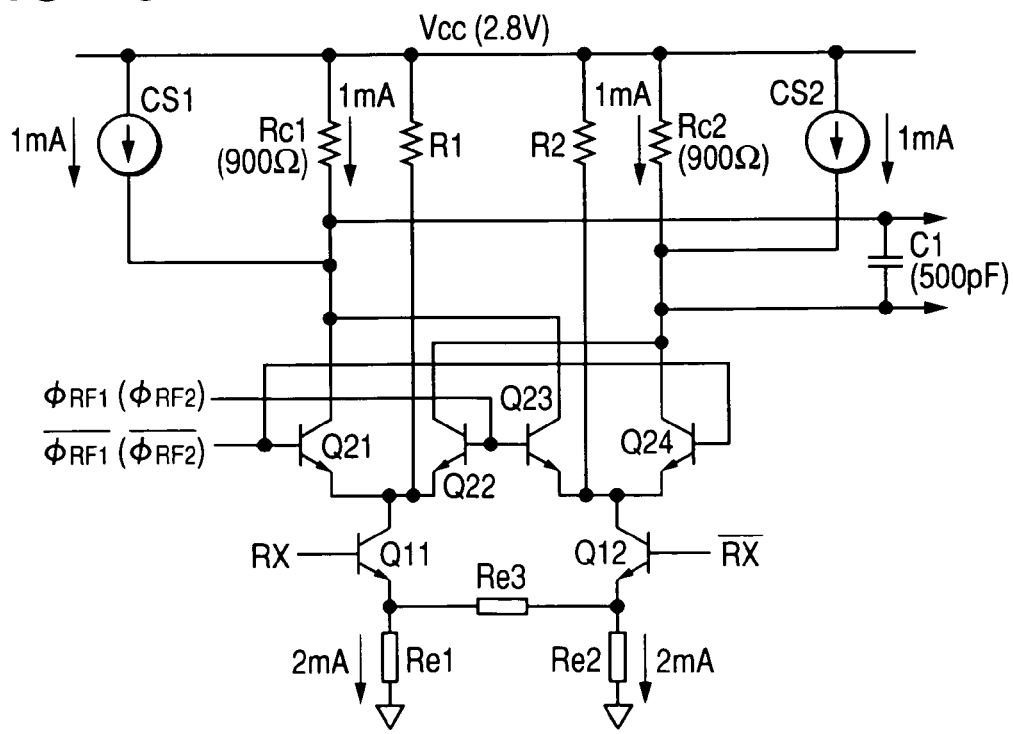
FIG. 5 is a circuit diagram showing a third embodiment of the mixer circuit included in the receiver circuit of the RF IC according to the present invention.

FIG. 5 shows an example of configuration of a mixer circuit according to a third embodiment.

In this embodiment, resistors R1 and R2 connected between a supply voltage terminal and the collectors of the lower stage differential transistors Q11 and Q12, respectively, are used as the current sources CS1 and CS2 for current application. A suitable resistance range for the resistors R1 and R2 is from several hundred ohms to several kilo-ohms. When the resistors R1 and R2 each having a resistance in the range of several hundred ohms to several kilo-ohms are connected between the supply voltage terminal and the collectors of the lower stage differential transistors Q11 and Q12, respectively, the resistors R1 and R2 are higher in impedance than the collector connection nodes of the lower stage differential transistors Q11 and Q12, so that no problem is caused circuitwise.

When PMOFETs are used in a mixer circuit, they generate larger noise than resistors. In terms of the noise characteristic, therefore, the mixer circuit according to the present embodiment in which resistors are used with no PMOSFETs included is better than mixer circuits in which PMOSFETs are used. The embodiment shown in FIG. 4 in which PMOSFETs are used is, however, higher in current source impedance than the embodiment shown in FIG. 5 in which resistors are used with no PMOSFETs included. As far as the loss of signal current is concerned, the embodiment shown in FIG. 4 can achieve a better result than the embodiment shown in FIG. 5. The embodiment shown in FIG. 5, however, does not cause any significant problem. The reasons why will be explained below with reference to FIGS. 6 to 8.

Figure 6:
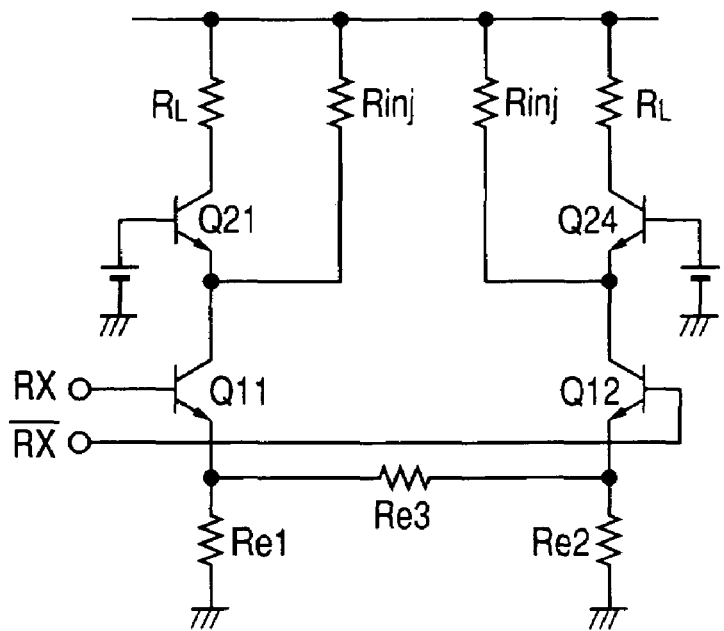
Figure 7:
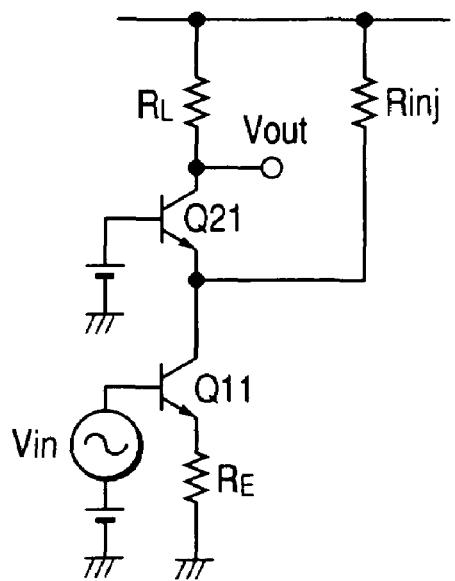
FIG. 7 is a circuit diagram showing a left half part of the equivalent circuit shown in FIG. 6.
Figure 8:
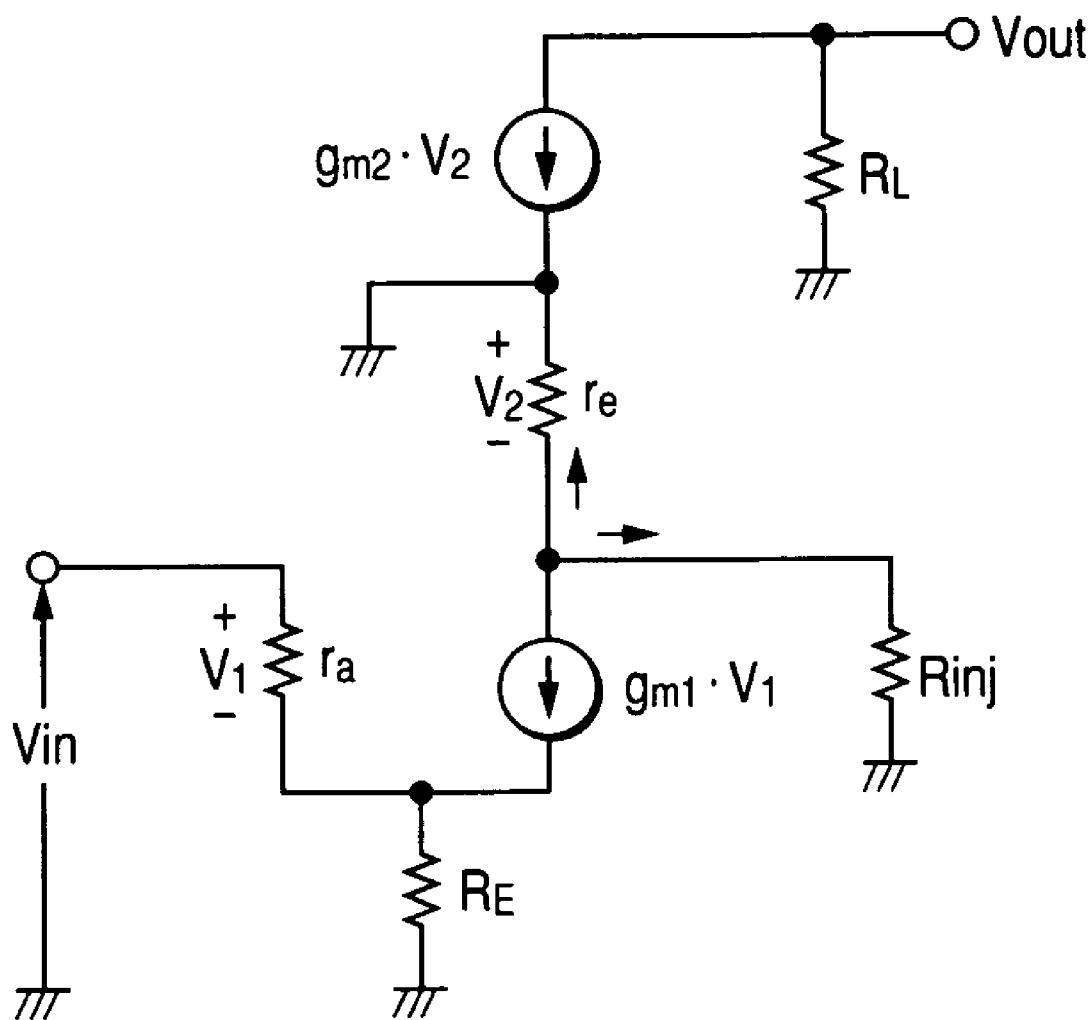
FIG. 8 is a circuit diagram showing an AC equivalent circuit of the circuit shown in FIG. 7.

Based on the mixer circuit configuration shown in FIG. 5, in which the resistors R1 and R2 are used as current sources, the loss of signal current caused by the resistors R1 and R2 will be examined in the following. FIG. 6 shows an equivalent circuit of the circuit shown in FIG. 5 with the upper stage differential transistors Q21 and Q24 being on. Focusing on the left half of the circuit shown in FIG. 6 that has a symmetrical configuration, it is known, as shown in FIG. 7, that the upper transistor Q21 of the left half circuit functions with its base grounded and that the lower transistor Q11 functions with its emitter, having a resistance RE, grounded. FIG. 8 shows an AC equivalent circuit of the circuit shown in FIG. 7. The emitter resistance RE of the lower transistor Q11 is several tens of ohms, so that it is smaller than the resistance of each of the resistors R1 and R2 ranging from several hundred ohms to several kilo-ohms.

The impedance, as viewed from the emitter side, of the base-grounded transistor Q21 shown in FIG. 7 is represented by "re" in FIG. 8. A signal current gm1·v1 generated by input voltage Vin is divided into "re" and a current source equivalent resistance Rinj. The current flowing on the Rinj side is a loss current Iloss. The loss current ratio is given by: re/(Rinj+re). The impedance "re", as viewed from the emitter side, of the base-grounded transistor Q21 is given by the following equation:

$$re = \alpha/gm = (1/gm) \cdot \beta/(1+\beta)$$

When β=hfe=250, the collector current of the base-grounded transistor is 1 mA, and the base voltage is 26 mV, gm is 1 mA/26 mV. Hence, based on the above equation:

$$re = 26 \times 250/(1+250) = 25.9 \text{ ohms}$$

Therefore, where the equivalent resistance Rinj is 1.8 kilo-ohms (=1800 ohms), the loss current Iloss is calculated as follows:

$$Iloss = re/(Rinj+re) = 25.9/(1800+25.9) = 0.0142$$

Thus, it is known that the loss current being only 1.4% of the total signal current gm1·v1 is extremely small.

Finally, the RF IC 200 shown in FIG. 1 will be described in detail. The RF IC 200 in the example shown in FIG. 1 is configured to be capable of modulating and demodulating signals in four frequency bands, that is, GSM850, GSM900, DCS1800, and PCS1900. A signal receiving portion of the system is provided with corresponding filters, that is, the filters 420a and 420b that pass reception signals in the GSM frequency bands, the filter 420c that passes reception signals in the DCS1800 frequency band, and the filter 420d that passes reception signals in the PCS1900 frequency band.

The receiver circuit RXC includes low-noise amplifiers 210a, 210b, 210c and 210d for amplifying reception signals in the GSM, DCS and PCS frequency bands, the frequency dividing phase shift circuit 211 that generates orthogonal signals, which are 90° degrees apart in phase from each other, by frequency-dividing the local oscillator signal φRF generated by the RF oscillator circuit (RFVCO) 262 being described later, the mixers 212a and 212b that are configured as in the foregoing embodiments and that demodulate and downconvert the reception signals amplified by the low-noise amplifiers 210a, 210b, 210c and 210d by mixing them with the orthogonal signals generated by the frequency dividing phase shift circuit 211, high-gain amplifier sections 220A and 220B which amplify demodulated I and Q signals and then output the I and Q signals to the baseband circuit 300, and a gain control and calibration circuit 213 which controls the amplifier gain in the high-gain amplifier sections 220A and 220B and cancel input DC offsets.

The high-gain amplifier section 220A has a configuration in which plural gain control amplifiers PGA11, PGA12 and PGA13 and plural low-pass filters LPF11, LPF12 and LPF13 are alternately connected in series with an amplifier AMP1 being connected at the final stage. The high-gain amplifier section 220A amplifies a demodulated I signal and outputs it to the baseband circuit 300. Similarly, the high-gain amplifier section 220B has a configuration in which plural gain control amplifiers PGA21, PGA22 and PGA23 and plural low-pass filters LPF21, LPF22 and LPF23 are alternately connected in series with an amplifier AMP2 being connected at the final stage. The high-gain amplifier section 220B amplifies a demodulated Q signal and outputs it to the baseband circuit 300.

The gain control and calibration circuit 213 includes AD converter circuits (ADC) which correspond to the gain control amplifiers PGA11 to PGA13 and PGA21 to PGA23 and which convert their output potential differences with their input terminals short-circuited to digital signals, DA converter circuits (DAC) each of which generates, based on the result of conversion made by the corresponding AD converter circuit, an input offset voltage to reduce the output DC offset of the corresponding one of the gain control amplifiers PGA11 to PGA13 and PGA21 to PGA23 to zero and each of which applies the generated input offset voltage to a differential input of the corresponding gain control amplifier, and a control circuit which controls the AD converter circuits (ADC) and DA converter circuits (DAC) to make them perform calibration.

The control circuit CTC includes a control logic 260 which controls the entire chip, a reference oscillator circuit (DCXO) 261 which generates a reference oscillator signal φref, an RF oscillator circuit (RFVCO) 262 which is a local oscillator circuit for generating an RF oscillator signal φRF for use in frequency conversion, an RF synthesizer 263 which, along with the RF oscillator circuit (RFVCO), makes up a PLL circuit, a frequency dividing circuit 264 which, by frequency dividing the oscillator signal φRF generated by the RFVCO 262, generates an intermediate frequency signal φIF required for modulation and first upconversion of a transmission signal, frequency dividing circuits 265 and 266 which generate, by frequency dividing the oscillator signal φRF, a signal required for frequency modulation of a feedback signal of a transmission PLL circuit, and mode changeover switches SW1 and SW2.

The switches SW1 and SW2 have their connections changed between a GSM mode in which signals are transmitted and received based on a GSM system and a DCS/PCS mode in which signals are transmitted and received based on a DCS or PCS system so as to select a frequency division ratio for a signal to be communicated. These switches are controlled by signals from the control logic 260. The reference oscillator signal φref is required to be high in frequency accuracy, so that an external crystal oscillator is connected to the reference oscillator circuit 261.

In the RX-PLL circuit, the oscillation frequency setting of the RFVCO 262 is different between reception mode and transmission mode. In the reception mode, the oscillation frequency fRF of the RFVCO 262 is set to be, for example, in a range of 3,476 to 3,576 MHz for GSM850, in a range of 3,700 to 3,840 MHz for GSM900, in a range of 3,610 to 3,730

MHz for DCS, or in a range of 3,860 to 3,980 MHz for PCS. In the case of GSM, the oscillator signal is frequency divided by two in the frequency dividing circuit 264. In the case of DCS and PCS, the oscillator signal is sent to the frequency dividing phase shift circuit 211 where it is frequency divided and phase shifted to be subsequently sent, as orthogonal signals, to the mixers 212a and 212b.

The RFVCO 262 and a TXVCO 240 each include an LC resonance oscillator circuit. In the LC resonance circuit, plural capacitive elements are arranged, each via a switching element, in parallel. The switching elements are selectively turned on by a band switching signal to make switching between the capacitive elements to be connected, that is, between the values of C of the LC resonance circuit. In this configuration, the oscillation frequency can be changed stepwise. The RFVCO 262 and the TXVCO 240 each have an internal variable capacitance element whose capacitance is varied by a control voltage supplied, in the case of the RFVCO 262, from a loop filter included in the RF synthesizer 263 or, in the case of the TXVCO 240, from a loop filter 237 allowing the oscillation frequency to be changed continuously.

The RF synthesizer 263 includes a variable frequency dividing circuit which frequency divides the oscillator signal φRF generated by the RFVCO 262, a phase comparator circuit which detects the phase difference between the reference oscillator signal φref, for example, a 26 MHz signal, generated by the reference oscillator circuit (DCXO) 261 and a signal resulting from frequency division by the variable frequency dividing circuit, a charge pump which generates and outputs a current whose amount corresponds to the phase difference detected by the phase comparator circuit, and a loop filter which generates a voltage corresponding to the current outputted from the charge pump, the current corresponding to the detected phase difference. The voltage smoothed by the loop filter is fed back, as an oscillation control voltage Vt, to the RXVCO 262 to enable oscillation at a frequency corresponding to the Vt.

The RF IC 200 according to the present embodiment, to set a frequency division ratio for the variable frequency dividing circuit included in the RF synthesizer 263, has required information supplied from outside. The information includes channel information specifying a frequency to be set, band information specifying a band to be used out of GSM850, GSM900, DCS and PCS, mode information specifying transmission mode or reception mode, and frequency division ratio setting information to be set in the IF frequency dividing circuit 264. Based on the information, the RF IC 200 internally determines the frequency division ratio for the variable frequency dividing circuit. The channel information, for example, a quotient obtained by dividing a transmission or reception frequency by 100 kHz, is inputted from the baseband circuit 300.

The control logic 260 has a clock signal CLK for synchronization, a data signal SDATA and a load enable signal LEN, which is a control signal, supplied from the baseband circuit 300. When the load enable signal LEN is asserted to an effective level, the control logic 260, in synchronization with the clock signal CLK, sequentially takes in the data signal SDATA transmitted from the baseband circuit 300 and generates control signals for use in the chip in accordance with commands included in the data signal SDATA. Though not particularly limited, the data signal SDATA is transmitted serially.

The transmitter circuit TXC includes a frequency dividing phase shift circuit 232, modulation circuits 233a and 233b, an adder 234, the transmission oscillator circuit (TXVCO) 240, a downconverting mixer 235, a phase comparator 236, the loop filter 237, a frequency dividing circuit 238, and transmission output buffer circuits 239a and 239b. The frequency dividing phase shift circuit 232 divides by two the frequency of an intermediate frequency signal φIF, for example, a 160 MHz signal generated by frequency dividing, in the frequency dividing circuit 264, the oscillator signal φRF generated by the RFVCO 262 and thereby generates orthogonal signals being 90 degrees apart in phase from each other. The modulation circuits 233a and 233b modulate, using the I and Q signals supplied from the baseband circuit 300, the generated orthogonal signals. The adder 234 combines the modulated signals. The transmission oscillator circuit (TXVCO) 240 generates a transmission signal φTX of a prescribed frequency. The downconverting mixer 235 mixes a feedback signal generated by extracting, using couplers 280a and 280b, the transmission signal φTX outputted from the transmission oscillator circuit (TXVCO) 240 and attenuating the extracted signal using an attenuator ATT and a signal φRF' generated by frequency dividing the RF oscillator signal φRF generated by the RF oscillator circuit (RFVCO) 262, and thereby generates a signal of a frequency equivalent to the frequency difference between the feedback signal and the φRF' signal. The phase comparator 236 compares the output of the mixer 235 and a signal TXIF synthesized at the adder 234 and thereby detects a frequency difference between them. The loop filter 237 generates a voltage corresponding to the output of the phase comparator 236. The frequency dividing circuit 238 frequency divides the output of the transmission oscillator circuit (TXVCO) 240 thereby generating a GSM transmission signal.

The transmitter circuit according to the present embodiment uses an offset PLL system. In the offset PLL system, transmission I and Q signals are orthogonally modulated, using an intermediate frequency carrier; a feedback signal outputted from the TXVCO 240 is mixed with the signal φRF' generated by frequency dividing the RF oscillator signal φRF generated by the RFVCO 262 and thereby the feedback signal is downconverted to a signal of an intermediate frequency equivalent to the frequency difference between the feedback signal and the φRF' signal; the phases of the intermediate frequency signal and the orthogonally modulated signal are compared; and the TXVCO 240 is controlled according to the phase difference between them. And the buffer circuits 239a and 239b perform transmission output.

In the multi-band radio communication system according to the present embodiment, the control logic 260 changes, for example, responding to a command received from the baseband circuit 300 when transmitting or receiving a signal, the oscillator signal frequency φRF generated by the RF oscillator circuit 262 according to the band and channel being used. At the same time, the control logic 260 operates the switches SW1 and SW2 in accordance with the mode used, GSM or DCS/PCS, so as to change the frequency of the oscillator signal to be supplied to the receiver circuit RXC or transmitter circuit TXC. In this way, switching is made between the transmission frequency and the reception frequency.

The output of the downconverting mixer 235 is supplied to the phase comparator 236 via a path which differs between GMS mode for GMSK modulation and EDGE mode for 8PSK modulation. Switches SW3 and SW4 are provided for use in switching the path. The signal path used in GSM mode is provided with a buffer BFF1, a low-pass filter SLPF1, and a buffer BFF2. The signal path used in EDGE mode is provided with a variable gain amplifier MVGA, a low-pass filter MLPF2, a limiter LIM2, and a low-pass filter LPF3.

The path through which the output of the mixer 235 is supplied to the phase comparator 236 differs between GSM mode for GMSK modulation and EDGE mode for 8PSK modulation. To be compatible with this arrangement, a switch SW5 is provided to switch the path through which an intermediate frequency transmission signal synthesized at the adder 234 after orthogonal modulation at the mixers 233a and 233b is supplied to the phase comparator 236. In EDGE mode, the intermediate frequency transmission signal is supplied to the phase comparator 236 via a limiter LIM1 and a low-pass filter LPF4.

Furthermore, the transmitter circuit TXC according to the present embodiment includes an amplitude comparator circuit 244 which, for amplitude control in EDGE mode, compares the output of the downconverting mixer 235 and the transmission signal synthesized, after orthogonal modulation at the mixers 233a and 233b, at the adder 234 and detects an amplitude difference between them, a loop filter 245 which limits the bandwidth of the output of the amplitude comparator circuit 244, a variable gain amplifier (IVGA) 246 which amplifies the band-limited signal, a voltage to current converter circuit 247 which converts the amplified voltage of the amplitude control loop into a current, a level converter circuit 248, and a filter 249 which converts a current into a voltage. In the transmitter circuit TXC including these components, phase modulation and amplitude modulation can be performed concurrently.

In GSM mode, the amplitude comparator circuit 244, the variable gain amplifier 246, the voltage to current converter circuit 247, and the level converter circuit 248 arranged along the forward path of the amplitude control loop are kept inactive. The output of the amplitude loop is supplied to a control circuit 431 which controls a supply voltage vdd in the power module 430, making it possible to control supply voltages for power amplifiers 431a and 431b so as to keep their output voltages at a desired level. The power amplifier 431a is an amplifier for GSM signals. The power amplifier 431b is an amplifier for DCS and PCS signals.

The present invention made by the inventors has been concretely described based on the embodiments, but the present invention is not limited to the embodiments. For example, even though, in the foregoing embodiments, the load resistance of each mixer circuit is doubled causing the amount of current to be halved, and a current source for supplying a current equivalent to the halved amount of current is provided, the factor by which to increase the load resistance is not limited to 2. It may be increased by an optional factor, for example, 1.5 or 3. Also, in the foregoing embodiments, the resistor Re3 is provided between the emitters of the lower stage differential transistors Q11 and Q12 included in each of the mixer circuits 212a and 212b, but the resistor Re3 may be omitted. The resistor Re3 provided between the emitters makes gain adjustment for the mixer circuit easier. The resistors Re1 and Re2 are connected between the emitters of the Q11 and Q12 and ground, respectively. A transistor which works as a constant current source may be used instead of the resistors Re1 and Re2.

Furthermore, even though the mixer circuits used in the foregoing embodiments include bipolar transistors, the present invention is also applicable to mixer circuits including MOSFETs instead of bipolar transistors. The current mirror circuit used to apply a current may also include bipolar transistors instead of PMOSFETs.

In the foregoing description, the present invention made by the inventors has been described based on cases where the invention is applied to an RF IC for use in a radio communication system of a portable telephone capable of communication based on three communication systems, that is, GSM, DCS and PCS which comprise a field of application the invention is intended for. The application of the invention, however, is not limited to such an RF IC. The present invention can also be applied to, for example, an RF IC for use in a portable telephone based on a CDMA system or for use in a wireless LAN system or a radio communication system using Bluetooth technology.

What is claimed is:

1. A semiconductor integrated circuit, comprising:
    a first transistor through which a direct current and an alternate current corresponding to an input signal of a first frequency are passed;
    a second transistor, to an emitter or source of which an output current from a collector or drain of the first transistor is inputted, to a control terminal of which a signal of a second frequency is applied, and from a collector or drain of which a signal generated by combining the input signal of the first frequency and the signal of the second frequency is outputted; and
    a low-pass filter including a load resistor and a capacitive element and being connected to the collector or drain of the second transistor;
    wherein a current injection circuit for applying a part of the direct current passing through the first transistor without making the part of the direct current pass through the load resistor is provided, and
    wherein the load resistor and the capacitive element are formed on a semiconductor substrate where the first transistor and the second transistor are also formed.

2. The semiconductor integrated circuit according to claim 1,
    wherein the current injection circuit is a constant current source for applying a prescribed amount of current,
    wherein the load resistor is connected between an operating supply voltage terminal and the collector or drain of the second transistor, and
    wherein the constant current source is connected, in parallel with the load resistor, between the operating supply voltage terminal and the collector or drain of the second transistor.

3. The semiconductor integrated circuit according to claim 1,
    wherein the current injection circuit is a constant current source for applying a prescribed amount of current,
    wherein the load resistor is connected between an operating supply voltage terminal and the collector or drain of the second transistor, and
    wherein the constant current source is connected between the operating supply voltage terminal and an emitter or source of the first transistor.

4. The semiconductor integrated circuit according to claim 2,
    wherein the current injection circuit is a current mirror circuit for applying a prescribed amount of current.

5. The semiconductor integrated circuit according to claim 1,
    wherein the load resistor is connected between an operating supply voltage terminal and the collector or drain of the second transistor, and
    wherein a resistor is connected as the current injection circuit between an operating supply voltage terminal and the collector or drain of the first transistor.

6. A semiconductor integrated circuit, comprising:

a first pair of transistors through which a direct current and an alternate current corresponding to a differential input signal of a first frequency are passed;

second and third pairs of transistors, to common emitters or common sources of which output currents from collectors or drains of the first pair of transistors are inputted respectively, to control terminals of which a differential signal of a second frequency is applied, and from collectors or drains of which a differential signal generated by combining the differential input signal of the first frequency and the differential signal of the second frequency is outputted; and a low-pass filter which includes a first load resistor connected to one of common collectors or one of common drains of the second and third pairs of transistors, a second load resistor connected to the other of the common collectors or the other of the common drains of the second and third pairs of transistors, and a capacitive element connected between the one of the common collectors or the one of the common drains of the second and third pairs of transistors and the other of the common collectors or the other of the common drains of the second and third pairs of transistors;

wherein a current injection circuit for applying a part of the direct current passing through the first pair of transistors without making the part of the direct current pass through the first and second load resistors is provided, and wherein the first and second load resistors and the capacitive element are formed on a semiconductor substrate where the first, second and third pairs of transistors are also formed.

7. The semiconductor integrated circuit according to claim 6, wherein the differential input signal of the first frequency is a reception signal, wherein the differential signal of the second frequency is an oscillator signal from an oscillator circuit, and wherein a signal having a frequency component equivalent to a difference in frequency between the reception signal and the oscillator signal is outputted.

8. The semiconductor integrated circuit according to claim 7, wherein first differential oscillator signals being 90 degrees apart in phase from each other are inputted to the control terminals of the second pair of transistors, respectively, and wherein second differential oscillator signals being 90 degrees apart in phase from the first differential oscillator signals, respectively, and being 180 degrees apart in phase from each other are inputted to the control terminals of the third pair of transistors, respectively.

9. The semiconductor integrated circuit according to claim 6, wherein the current injection circuit is a current mirror circuit for applying a prescribed amount of current.

10. The semiconductor integrated circuit according to claim 6, wherein the current injection circuit comprises resistive elements connected between an operating supply voltage terminal and the collector or drain of each of the first pair of transistors.

* * * * *